(12) United States Patent
Kim

(10) Patent No.: US 10,644,240 B2
(45) Date of Patent: May 5, 2020

(54) DEPOSITION MASK, APPARATUS FOR MANUFACTURING DISPLAY APPARATUS, AND METHOD OF MANUFACTURING DISPLAY APPARATUS

(71) Applicant: Samsung Display Co., Ltd., Yongin-si (KR)

(72) Inventor: Sanghoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/199,782

(22) Filed: Nov. 26, 2018

(65) Prior Publication Data

US 2019/0097134 A1 Mar. 28, 2019

Related U.S. Application Data

(62) Division of application No. 15/447,504, filed on Mar. 2, 2017, now Pat. No. 10,141,511.

(30) Foreign Application Priority Data

Mar. 9, 2016 (KR) .................. 10-2016-0028296

(51) Int. Cl.
*H01L 51/00* (2006.01)
*H01L 27/32* (2006.01)
(Continued)

(52) U.S. Cl.
CPC ........ *H01L 51/0011* (2013.01); *C23C 14/042* (2013.01); *H01L 27/3244* (2013.01);
(Continued)

(58) Field of Classification Search
CPC . H01L 51/0011; H01L 51/0014; H01L 51/56; H01L 27/3295; C23C 14/042; C30B 25/04
See application file for complete search history.

(56) References Cited

U.S. PATENT DOCUMENTS 8,881,676 B2 11/2014 Hong
9,246,119 B2 1/2016 Shim et al.
(Continued)

FOREIGN PATENT DOCUMENTS

KR 10-2012-0120703 11/2012
KR 10-2014-0070255 6/2014
(Continued)

OTHER PUBLICATIONS

Non-Final Office Action dated Jan. 2, 2018, issued in the U.S. Appl. No. 15/447,504.
(Continued)

*Primary Examiner* — Mohsen Ahmadi
(74) *Attorney, Agent, or Firm* — H.C. Park & Associates, PLC

(57) ABSTRACT

A deposition mask extending in a first direction may include: a pattern portion including a plurality of pattern holes; and a clamping portion including a protrusion portion to be attached to the clamp and an indentation portion formed in a direction toward the pattern portion, wherein the pattern portion may include a blocking portion that at least partially overlaps the protrusion portion in the first direction and has an area gradually decreasing in a second direction from the protrusion portion toward the indentation portion, the second direction crossing the first direction.

6 Claims, 12 Drawing Sheets

(51) Int. Cl.
*C23C 14/04* (2006.01)
*H01L 51/56* (2006.01)
*C30B 25/04* (2006.01)

(52) U.S. Cl.
CPC ............ *C23C 14/04* (2013.01); *C23C 14/044* (2013.01); *C30B 25/04* (2013.01); *H01L 27/3295* (2013.01); *H01L 51/0014* (2013.01); *H01L 51/56* (2013.01); *H01L 2227/323* (2013.01)

(56) References Cited

U.S. PATENT DOCUMENTS

| | | | |
|---|---|---|---|
| 9,780,305 B2 | 10/2017 | Kwen et al. | |
| 2003/0101932 A1 | 6/2003 | Kang | |
| 2005/0115503 A1* | 6/2005 | Hagiwara | C23C 14/042 118/721 |
| 2006/0012290 A1 | 1/2006 | Kang | |
| 2006/0103289 A1* | 5/2006 | Kim | C23C 14/042 313/402 |
| 2010/0055810 A1* | 3/2010 | Sung | C23C 14/042 438/22 |
| 2011/0157575 A1 | 6/2011 | Lee | |
| 2011/0168087 A1* | 7/2011 | Lee | C23C 14/042 118/504 |
| 2011/0171768 A1 | 7/2011 | Hong et al. | |
| 2012/0266813 A1* | 10/2012 | Hong | C23C 14/044 118/505 |
| 2012/0279444 A1* | 11/2012 | Hong | C23C 14/042 118/504 |
| 2013/0071775 A1 | 3/2013 | Prushinskiy et al. | |
| 2013/0137334 A1 | 5/2013 | Ishikawa | |
| 2013/0199443 A1* | 8/2013 | Kim | B05B 12/20 118/504 |
| 2013/0298826 A1* | 11/2013 | Park | B05C 21/005 118/504 |
| 2014/0065355 A1* | 3/2014 | Kang | C23C 14/042 428/136 |
| 2014/0130735 A1* | 5/2014 | Kim | H01L 51/0011 118/504 |
| 2014/0150721 A1 | 6/2014 | Oh et al. | |
| 2015/0007768 A1 | 1/2015 | Lee | |
| 2015/0101536 A1* | 4/2015 | Han | C23C 14/042 118/721 |
| 2016/0005970 A1* | 1/2016 | Kwen | H01L 51/0011 118/504 |
| 2016/0006001 A1 | 1/2016 | Lee et al. | |
| 2016/0101900 A1* | 4/2016 | Baek | B65D 25/10 438/99 |
| 2016/0126507 A1 | 5/2016 | Ko et al. | |
| 2016/0144393 A1 | 5/2016 | Kwon | |
| 2016/0260935 A1 | 9/2016 | Lee | |
| 2016/0333469 A1* | 11/2016 | Oh | C23C 16/4585 |
| 2016/0369389 A1* | 12/2016 | Ko | C23C 14/042 |
| 2017/0001259 A1* | 1/2017 | Han | B05B 12/20 |
| 2017/0056911 A1* | 3/2017 | Kang | H01L 51/0011 |
| 2017/0106472 A1* | 4/2017 | Han | B23K 26/21 |
| 2017/0125680 A1* | 5/2017 | Lee | H01L 51/0012 |
| 2017/0133592 A1* | 5/2017 | Baek | H01L 51/0011 |
| 2017/0141313 A1 | 5/2017 | Min | |
| 2017/0207390 A1* | 7/2017 | Kim | H01L 51/0011 |
| 2017/0244035 A1 | 8/2017 | Kawato et al. | |
| 2017/0250208 A1* | 8/2017 | Kim | H01L 27/127 |
| 2017/0365822 A1* | 12/2017 | Kim | H01L 27/3246 |
| 2017/0369983 A1* | 12/2017 | Yi | C23C 14/042 |

FOREIGN PATENT DOCUMENTS

| | | |
|---|---|---|
| KR | 10-2014-0096438 | 8/2014 |
| KR | 10-1469441 | 12/2014 |

OTHER PUBLICATIONS

Notice of Allowance dated Jul. 20, 2018, issued in the U.S. Appl. No. 15/447,504.

* cited by examiner

PRIOR ART

WRINKLE Peak to Peak : 601 μm

PRIOR ART

WRINKLE Peak to Peak : 538μm

DEPOSITION MASK, APPARATUS FOR MANUFACTURING DISPLAY APPARATUS, AND METHOD OF MANUFACTURING DISPLAY APPARATUS

CROSS-REFERENCE TO RELATED APPLICATIONS

This application is a Division of U.S. patent application Ser. No. 15/447,504, filed on Mar. 2, 2017, issued as U.S. Pat. No. 10,141,511, and claims priority from and the benefit of Korean Patent Application No. 10-2016-0028296, filed on Mar. 9, 2016, which are hereby incorporated by reference for all purposes as if fully set forth herein.

BACKGROUND

Field

Exemplary embodiments relate to a deposition mask, an apparatus for manufacturing a display apparatus, and a method of manufacturing the display apparatus.

Discussion of the Background

Mobile electronic apparatuses are widely used. Such mobile electronic apparatuses include small electronic apparatuses such as mobile phones, and also include tablet PCs which have become widely used more recently.

The mobile electronic apparatuses may provide various functions, and the mobile electronic apparatus may include a display apparatus to provide a user with visual information such as an image and a motion picture. Recently, as sizes of components that drive the display apparatus of such a mobile electronic apparatus have decreased, the importance of the display apparatus in such mobile electronic apparatuses has increased. Accordingly, the display apparatus may be developed to have a structure that is bent at a predetermined angle from a flat state.

An electrode including an organic material and/or a metal, which is deposited on a display apparatus, is manufactured by using a vacuum deposition method of forming a thin film wherein a material is deposited on a substrate in a vacuum environment. The vacuum deposition method includes placing a substrate, on which an organic thin film is to be formed, inside a vacuum chamber; attaching a mask, which includes the same pattern as the organic thin film to be formed, to the substrate; vaporizing the organic material by using a deposition source; and then depositing the vaporized organic material on the substrate.

Recently, there has been a demand for a display apparatus having a large size. Accordingly, deposition masks have been made larger. In order to implement a high resolution, it is important to reduce a shadow effect. To this end, during a deposition process, a deposition mask needs to closely contact a substrate and have a small thickness.

In general, in order to allow the deposition mask and the substrate to closely contact each other and obtain a structure in which a gap does not occur between the deposition mask and the substrate, a tensile force is applied to both ends of the deposition mask so that the deposition mask is installed in a frame in a flat state.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments may address a problem that occurs as a thickness of a deposition mask becomes smaller. During a process of applying a tensile force to both ends of the deposition mask, an unbalance of force takes place between a portion to which the tensile force is applied and the other portion to which the tensile force is not applied, and thus wrinkles are formed in the deposition mask.

Thus, exemplary embodiments provide a deposition mask having reduced wrinkles formed on the deposition mask, to reduce a gap between the deposition mask and a substrate during a deposition process and an apparatus for manufacturing a display apparatus.

Exemplary embodiments also provide a method of manufacturing the display apparatus using the above deposition mask.

Additional aspects will be set forth in part in the description which follows and, in part, will be apparent from the disclosure, or may be learned by practice of the inventive concept.

According to one or more embodiments, a deposition mask extending in a first direction may include: a pattern portion including a plurality of pattern holes; and a clamping portion including a protrusion portion to be attached to the clamp and an indentation portion formed in a direction toward the pattern portion, wherein the pattern portion may include a blocking portion that at least partially overlaps the protrusion portion in the first direction and has an area gradually decreasing in a second direction from the protrusion portion toward the indentation portion, the second direction crossing the first direction.

The plurality of pattern holes may be disposed corresponding to target deposition areas.

A number of the plurality of pattern holes that overlap the protrusion portion in the first direction may be less than a number of the plurality of pattern holes that overlap the indentation portion in the first direction.

A number of the plurality of pattern holes arranged in the first direction may be gradually reduced in a direction from the indentation portion toward the protrusion portion in the second direction.

The blocking portion may have an area gradually decreasing in a direction from the clamping portion toward the pattern portion in the first direction.

The blocking portion may have a multistep shape in the first direction and the second direction.

According to one or more embodiments, an apparatus for manufacturing a display apparatus may include a mask frame assembly disposed facing a substrate; and a deposition source disposed facing the mask frame assembly, wherein the mask frame assembly may include: a frame including an opening at a center portion thereof; a deposition mask disposed on the frame facing the substrate, the deposition mask being installed on the frame while being extended in a first direction by a clamp attached both ends of the deposition mask; and a support stick extending in a second direction crossing the first direction, covering a part of the deposition mask and supporting the deposition mask, wherein the deposition mask may include: a pattern portion including a plurality of pattern holes; and a clamping portion including a protrusion portion to be attached to the clamp and an indentation portion formed in a direction toward the pattern portion, wherein the pattern portion may include a blocking portion that at least partially overlaps the protrusion portion in the first direction and has an area gradually decreasing in a second direction from the protrusion portion toward the indentation portion, the second direction crossing the first direction.

The plurality of pattern holes may be disposed corresponding to target deposition areas.

A number of the plurality of pattern holes that overlap the protrusion portion in the first direction may be less than a number of the plurality of pattern holes that overlap the indentation portion in the first direction.

A number of the plurality of pattern holes arranged in the first direction may be gradually reduced in a direction from the indentation portion toward the protrusion portion in the second direction.

The blocking portion may have an area gradually decreasing in a direction from the clamping portion toward the pattern portion in the first direction.

The blocking portion may have a multistep shape in the first direction and the second direction.

According to one or more embodiments, a method of manufacturing a display apparatus may include inserting a substrate and a deposition mask assembly into an inside of a chamber; aligning the substrate and the mask frame assembly; and depositing, on the substrate, a depositing material ejected from a deposition source and passed through the mask frame assembly, wherein the mask frame assembly may include: a frame including an opening at a center portion thereof; a deposition mask disposed on the frame facing the substrate, the deposition mask being installed on the frame while being extended in a first direction by a clamp attached to both ends of the deposition mask; and a support stick extending in a second direction crossing the first direction, covering a part of the deposition mask, and supporting the deposition mask, wherein the deposition mask may include: a pattern portion including a plurality of pattern holes; and a clamping portion including a protrusion portion to be attached to the clamp and an indentation portion formed in a direction toward the pattern portion, wherein the pattern portion may include a blocking portion that at least partially overlaps the protrusion portion in the first direction and has an area gradually decreasing in a second direction from the protrusion portion towards the indentation portion, the second direction crossing the first direction.

The plurality of pattern holes may be disposed corresponding to target deposition areas.

A number of the plurality of pattern holes that overlap the protrusion portion in the first direction may be less than a number of the plurality of pattern holes that overlap the indentation portion in the first direction.

A number of the plurality of pattern holes arranged in the first direction may be gradually reduced in a direction from the indentation portion toward the protrusion portion in the second direction.

The blocking portion may have an area gradually decreasing in a direction from the clamping portion toward the pattern portion in the first direction.

The blocking portion may have a multistep shape in the first direction and the second direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
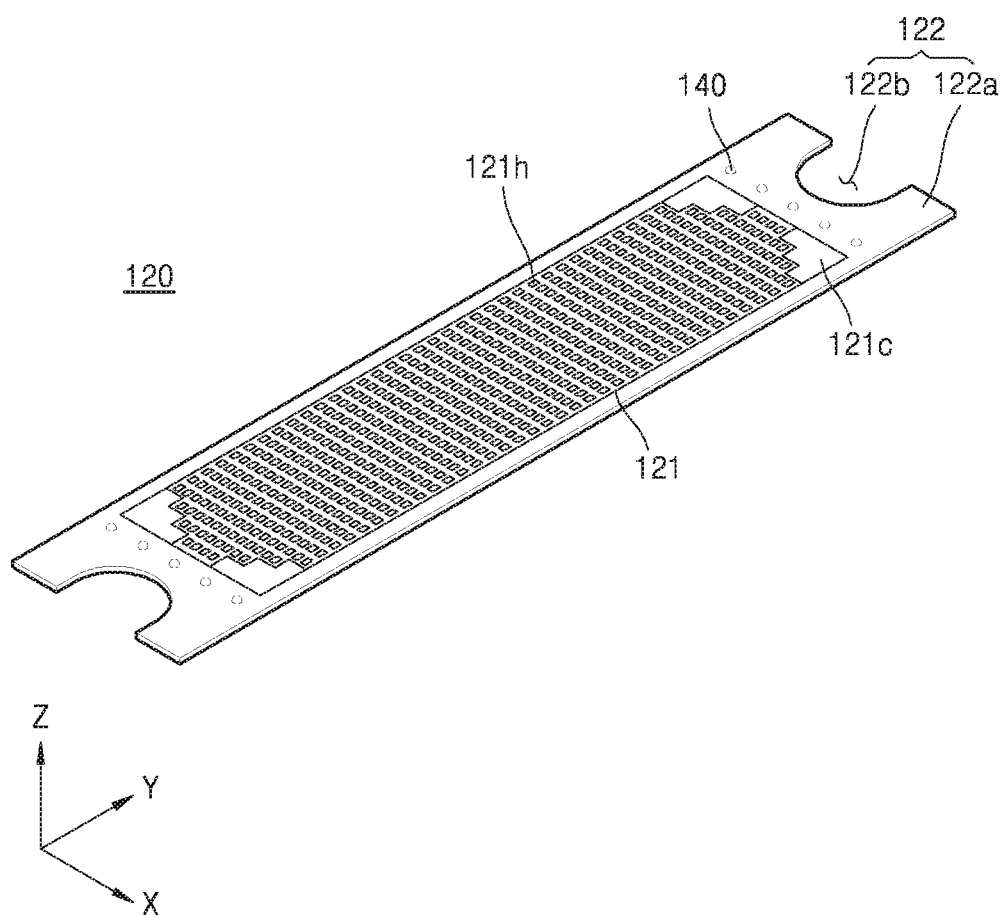
FIG. 1 is a perspective view schematically illustrating a deposition mask according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
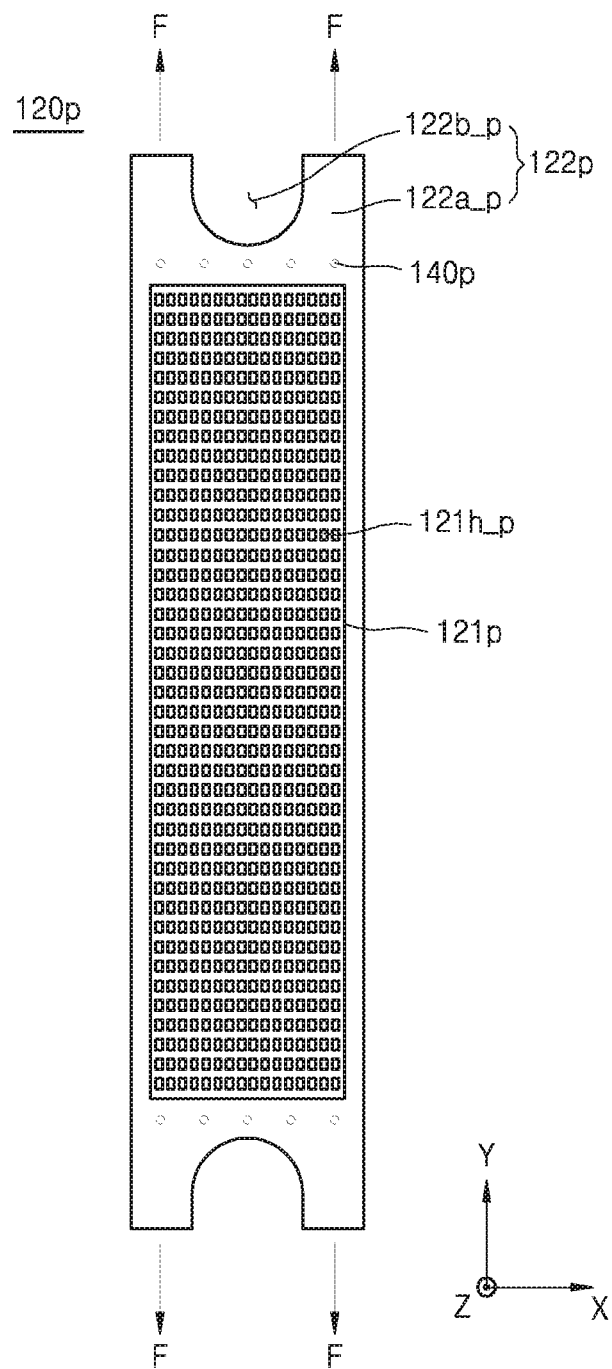
FIG. 2 is a plan view of a conventional deposition mask according to a comparable art.

120$p$ FIG. 2 is a plan view of the conventional deposition mask 120$p$ according to a comparable art. Referring to FIG. 2, the deposition mask 120$p$ may be used in a process of depositing an organic material or a metal on a substrate (11 of FIG. 9) of a display apparatus. In order to prevent a shadow phenomenon, both ends of the deposition mask 120$p$ may be attached to (for example, clamped by) a clamp and the deposition mask 120$p$ may be welded onto a frame (110 of FIG. 8) in a tight state.

In this regard, the "shadow phenomenon" is a phenomenon that causes a display defect of the substrate 21 when a deposition material is deposited on an area other than a preset target deposition area of the substrate 21 on which the deposition material needs to be deposited, due to a gap formed between the substrate 21 and the deposition mask 120$p$ since the substrate 21 and the deposition mask 120$p$ are not in close enough contact with each other 120$p$.

In detail, the clamp may clamp a protrusion 122$a$ p of a clamping portion 122$p$ of the deposition mask 120$p$ before the deposition mask 120$p$ is welded to the frame 110, a tensile force F may be applied to the deposition mask 120$p$ in a direction away from a center of the deposition mask 120$p$ in a clamping state, and the deposition mask 120$p$ may be tightly pulled. Thereafter, while both ends of the deposition mask 120$p$ are placed over the frame 110, a welding process of coupling the frame 110 and the deposition mask 120$p$ may be performed.

The frame 110 and the deposition mask 120$p$ may be coupled to each other through a welding portion 140$p$. Referring to FIG. 2, the welding portion 140$p$ is represented by a broken line to indicate that the deposition mask 120$p$ may be welded onto the frame 110 at the welding portion 140$p$.

After the welding process, both ends of the deposition mask 120$p$ that protrude to the outside of the frame 110 may be partially removed. Specifically, the clamping portion 122$p$ located outside the welding portion 140$p$ may be removed.

Figure 3A:
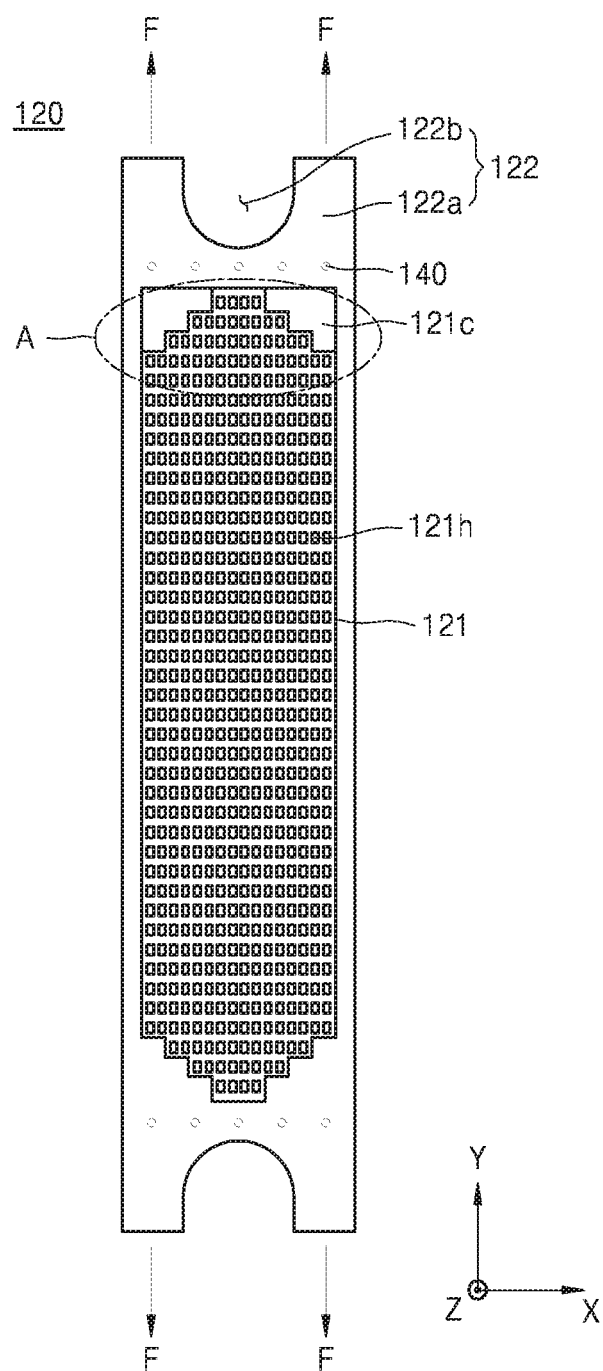
FIG. 3A is a plan view of the deposition mask illustrated in FIG. 1, according to an exemplary embodiment.
Figure 3B:
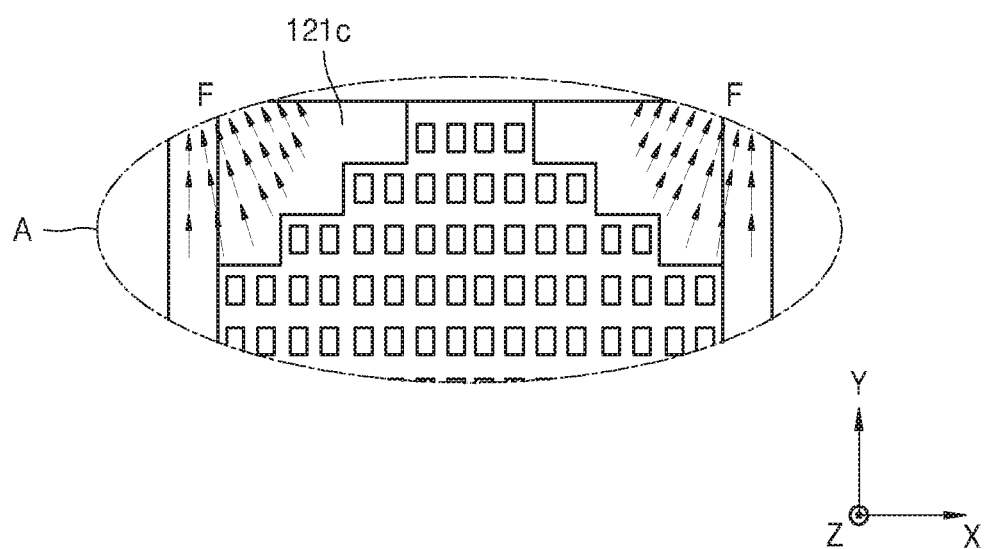
FIG. 3B is an enlarged plan view of a portion A of the deposition mask illustrated in FIG. 3A, according to an exemplary embodiment.
Figure 4:
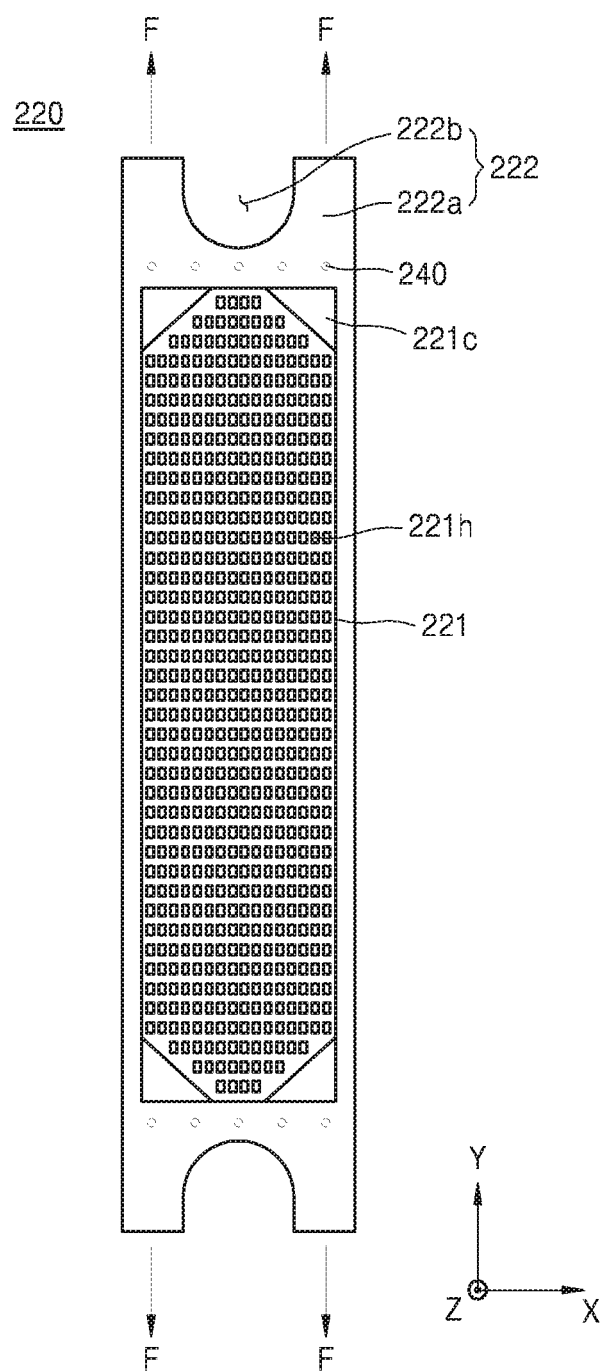
FIG. 4 is a plan view of an exemplary deposition mask, according to an exemplary embodiment.

FIG. 1 is a perspective view schematically of the deposition mask 120, according to an exemplary embodiment. FIG. 3A is a plan view of the deposition mask 120 illustrated in FIG. 1, according to an exemplary embodiment. FIG. 3B is an enlarged plan view of a portion A of the deposition mask 120 illustrated in FIG. 3A, according to an exemplary embodiment. FIG. 4 is a plan view of an exemplary deposition mask 120, according to an exemplary embodiment.

Referring to FIG. 1, the deposition mask 120 may include a pattern portion 121 and a clamping portion 122. The welding portion 140 is represented by a broken line to indicate that the deposition mask 120 of FIG. 1 may be coupled with the frame 110 by wending at the welding portion 140.

The pattern portion 121 may include a plurality of pattern holes 121$h$ through which the deposition material passes. The plurality of pattern holes 121$h$ may have the same shape to have corresponding areas. FIG. 1 illustrates the plurality of pattern holes 121$h$ having a rectangular shape, but the exemplary embodiments are not limited thereto. That is, the plurality of pattern holes 121$h$ may have various shapes, such as a polygon, a circle, or an ellipse. For convenience of description, a case where the plurality of pattern holes 121$h$ have the rectangular shape will be described below.

The clamping portion 122 may be located at both ends of the deposition mask 120 and attached to a clamp (not shown) when the deposition mask 120 is extended. The clamping portion 122 may include a protrusion portion 122$a$ that may be attached to the clamp and an indentation portion 122$b$ that is not attached to the clamp. The indentation portion 122$b$ may be formed in a direction toward the pattern portion 121. In general, an inner circumference of the indentation portion 122$b$ may have a curved surface so as to prevent deformation or damage to the deposition mask 120 due to a tensile force applied to the deposition mask 120. However, the exemplary embodiment is not limited thereto, and the indentation portion 122b may have one or more bending points.

In detail, the pattern portion 121 may at least partially overlap the protrusion portion 122a with respect to a first direction (Y axis direction) and may include a blocking portion 121c having an area gradually decreasing in a second direction from the protrusion portion 122a toward the indentation portion 122b, the second direction (X axis direction) crossing the first direction.

The blocking portion 121c may be connected to an area excluding the pattern portion 121 of the deposition mask 120, i.e., a main body of the deposition mask 120. That is, the blocking portion 121c may be a part of the main body of the deposition mask 120 and may be, for example, when the deposition mask 120 is formed of an invar alloy, the blocking portion 121c may be formed of the invar alloy.

That is, the blocking portion 121c may be formed with the same properties as the protrusion portion 122a of the clamping portion 122, and, the tensile force F may be applied to the blocking portion 121c when the tensile force F is applied to the protrusion portion 122a.

The blocking portion 121c may partially overlap or may not overlap the indentation portion 122b with respect to the first direction. In any case, the blocking portion 121c may be formed to have an area gradually decreasing toward a center of the indentation portion 122b in the second direction, and thus an area of the blocking portion 121c overlapping with the protrusion portion 122a may be greater than an area of the blocking portion 121c overlapping with the indentation portion 122b.

Specifically, FIG. 3A illustrates the tensile force F applied to the protrusion portion 122a in the first direction, and FIG. 3B illustrates the tensile force F applied in a region A around the pattern portion 121 that overlaps the protrusion portion 122a with respect to the first direction.

The blocking portion 121c may be provided in an area to which relatively higher tensile force F is. Thus, the blocking portion 121c may absorb a considerable portion of the tensile force F applied to the protrusion portion 122a to prevent or reduce the tensile force F applied to the pattern portion 121. The tensile force F is not directly applied to the indentation portion 122b, and thus the blocking portion 121c may have a relatively small area to effectively absorb the tensile force F transferred from the protrusion portion 122a.

That is, the tensile force F applied a partial area of the pattern portion 121 that overlaps the indentation portion 122b in the first direction is substantially smaller, so the blocking portion 121c may have a structure that does not overlap with the indentation portion 122b.

Next, the reason why the blocking portion 121c has a structure in which the blocking portion 121c and the protrusion portion 122a overlap is formed, when will be described in detail.

Referring to FIG. 2, the conventional deposition mask 120p may not include the blocking portion 121c of FIGS. 3A and 3B and may include a pattern hole 121h p in a location of the blocking portion 121c instead. When the tensile force F is applied to the conventional deposition mask 120p having such a structure, a non-uniform distribution of the tensile force F may be formed between one area of the pattern portion 121p that overlaps the protrusion portion 122a p with respect to the first direction and another area of the pattern portion 121p that overlaps the indentation portion 122b p with respect to the first direction. In this case, the tensile force F may be applied differently to different areas, and thus a deformation rate of each area may be different, which may cause wrinkles to form on a surface of the conventional deposition mask 120p.

The exemplary embodiments may provide a structure for improving the non-uniform distribution of the tensile force F applied to the pattern portion 121. That is, the blocking portion 121c having a relatively large area may be provided in one area of the pattern portion 121 that overlaps the pattern portion 122a to which the tensile force F is directly applied with respect to the first direction. The blocking portion 121c may absorb relatively greater tensile force F.

The blocking portion 121c may have a relatively small area provided in another area of the pattern portion 121 that overlaps the indentation portion 122b_p that is indirectly influenced by the tensile force F. Although the tensile force F is not directly applied to the indentation portion 122b_p with respect to the first direction, the blocking portion 121c may absorb relatively less of the tensile force F.

That is, the blocking portion 121c may have a structure in which the blocking portion 121c has an area gradually decreasing in a direction from the protrusion portion 122a to the indentation portion 122b. This may mean that the number of the pattern holes 121h that overlap the protrusion portion 122a with respect to the first direction is less than the number of the pattern holes 121h that overlap the indentation portion 122b with respect to the first direction.

As described above, since the plurality of pattern holes 121h are formed to have corresponding areas, an area in which a smaller number of the pattern holes 121h are formed in the first direction, i.e., an area in which the blocking portion 121c is greater with respect to the first direction, may have rigidity by which the tensile force F applied to the protrusion portion 122a may be sufficiently absorbed.

Accordingly, the above structure of the exemplary embodiment may prevent or reduce non-uniform application of the tensile force F to the pattern portion 121, and thereby the wrinkles caused by the non-uniform distribution of the tensile force F applied to the deposition mask 120 may be reduced or prevented.

The blocking portion 121c may have an area gradually decreasing in a direction from the clamping portion 122a toward the pattern portion 121 in the first direction (Y axis direction). FIGS. 1 and 3A illustrates that the blocking portion 121c has a multistep shape in the first and second directions, but the exemplary embodiments are not limited thereto. That is, as described above, the blocking portion 121c may have any structural shape having a large area may be formed in an area to which the tensile force F is relatively more applied, whereas the blocking portion 121c having a small area may be formed in an area to which the tensile force F is relatively less applied. For example, the blocking portion 121c may have an inclined shape as shown in FIG. 4.

An effect that may be achieved by using the deposition mask 120 having the above-described structure according to exemplary embodiments will be described with reference to FIGS. 5 and 6 below.

Figure 5:
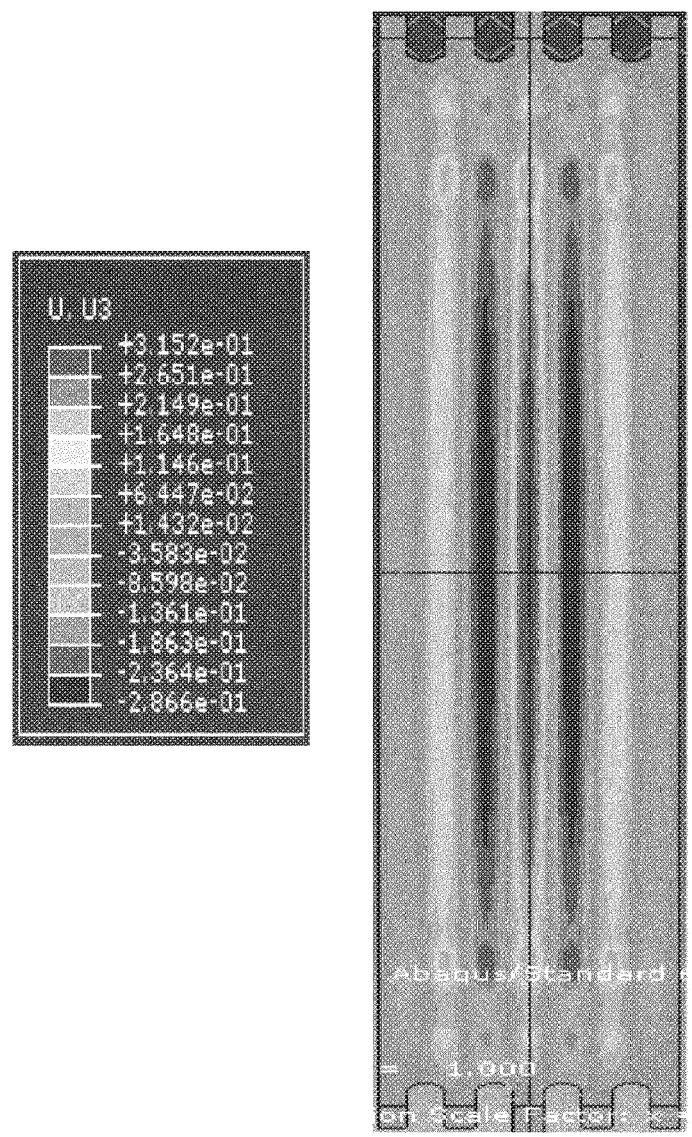
FIG. 5 is a graph illustrating a height of wrinkles of the conventional deposition mask illustrated in FIG. 2.

FIG. 5 is a graph illustrating a height of wrinkles of the conventional deposition mask 120p illustrated in FIG. 2. FIG. 6 is a graph illustrating a height of wrinkles of the deposition mask 120 illustrated in FIG. 3A.

Referring to FIG. 5, a peak-to-peak value of wrinkles is 601 µm in the conventional deposition mask 120p according to the conventional embodiment, illustrated in FIG. 2, that does not include the blocking portion 121c.

Figure 6:
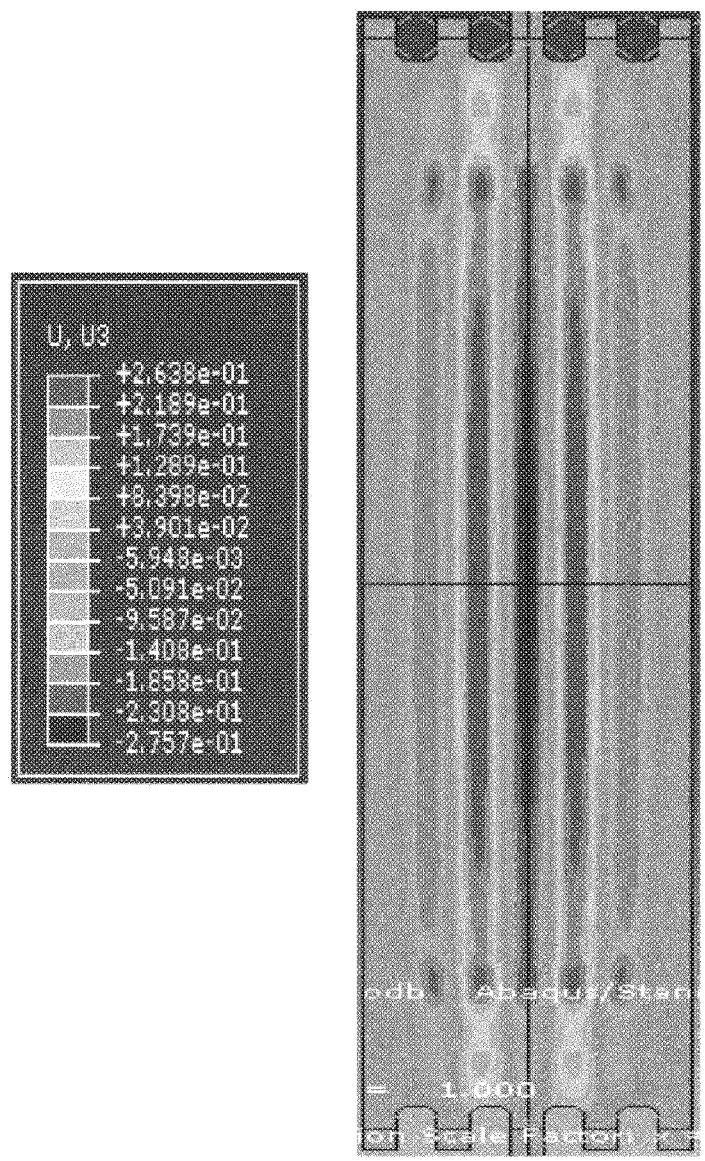
FIG. 6 is a graph illustrating a height of wrinkles of the deposition mask illustrated in FIG. 3A.

Meanwhile, referring to FIG. 6, a peak-to-peak value of the wrinkles is 538 µm in the deposition mask 120 according to an exemplary embodiment that includes the blocking portion 121c as shown in FIGS. 1 and 3A, and thus a wrinkle phenomenon may be improved by about 10.5% as compared with the deposition mask 120p. Materials of FIGS. 5 and 6 are experimental data obtained by comparing the deposition mask 120p of FIG. 2 and the deposition mask 120 according to an exemplary embodiment of FIGS. 1 and 3A.

Accordingly, a structure of the deposition mask 120 described above may reduce the wrinkle phenomenon that occurs due to a tensile force applied to the deposit mask 120. As the wrinkle phenomenon of the deposition mask 120 is reduced, a gap formed between a substrate and the deposition mask 120 during a deposition process may be reduced. Accordingly, a shadow phenomenon may be reduced, and thus, display defects may be reduced.

Figure 7:
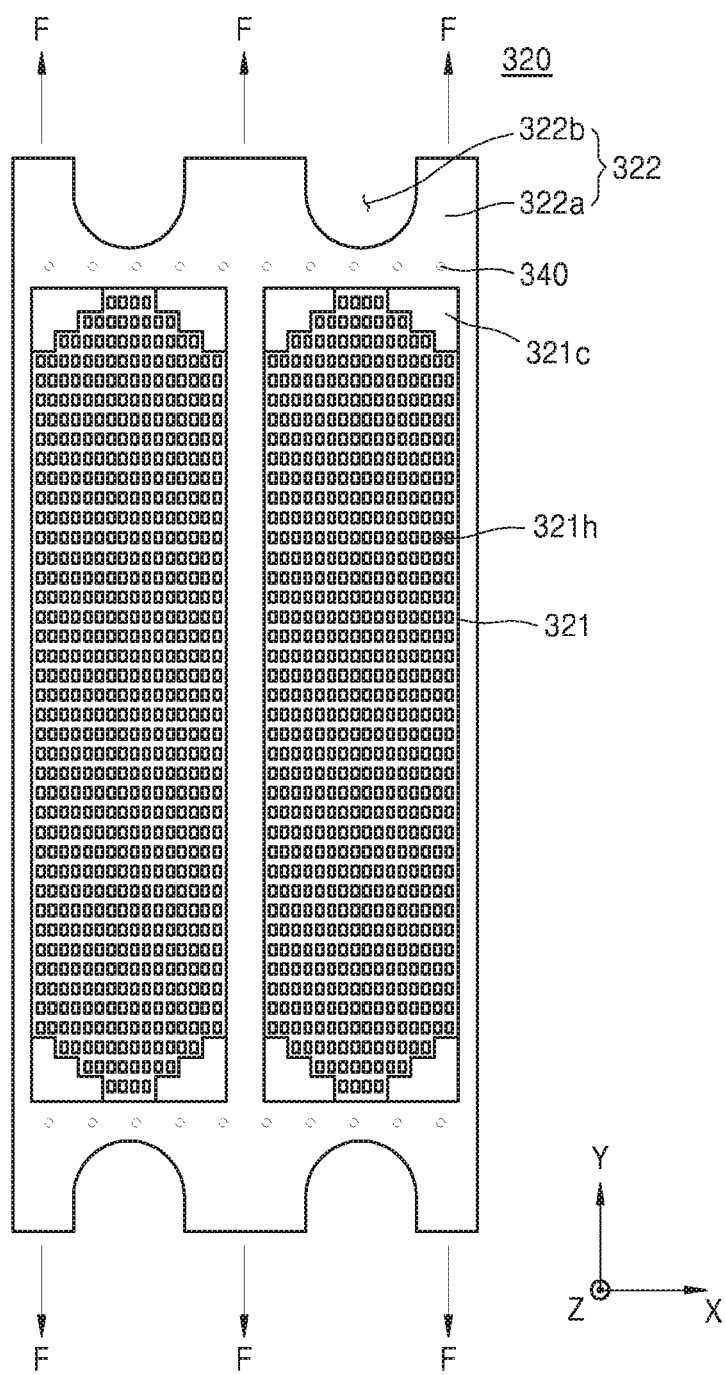
FIG. 7 is a plan view illustrating an exemplary deposition mask, according to an exemplary embodiment.

FIG. 7 is a plan view illustrating an exemplary deposition mask 120, according to an exemplary embodiment.

As another exemplary embodiment, referring to FIG. 7, the deposition mask 320 may be configured by connecting two deposition masks 120 of FIGS. 1 and 3A. However, the exemplary embodiments are not limited thereto, and the deposition mask 320 may be configured by connecting a plurality of deposition masks 120 of FIGS. 1 and 3A. That is, the deposition mask 320 may include a plurality of pattern portions 321 so that the deposition mask 320 may include a plurality of protrusion portions 322a and a plurality of indentation portions 322b.

The deposition mask 320 having the above structure may also include a blocking portion 321c having an area that overlaps the protrusion portion 322a in a first direction (Y axis direction), which is relatively larger than an another area that overlaps the indentation portion 322b the first direction.

The blocking portion 321c of FIG. 7 has the same structure as the blocking portion 121c of the deposition mask 120 according to an exemplary embodiment of FIGS. 1 and 3A, and thus a description thereof is omitted.

Figure 8:
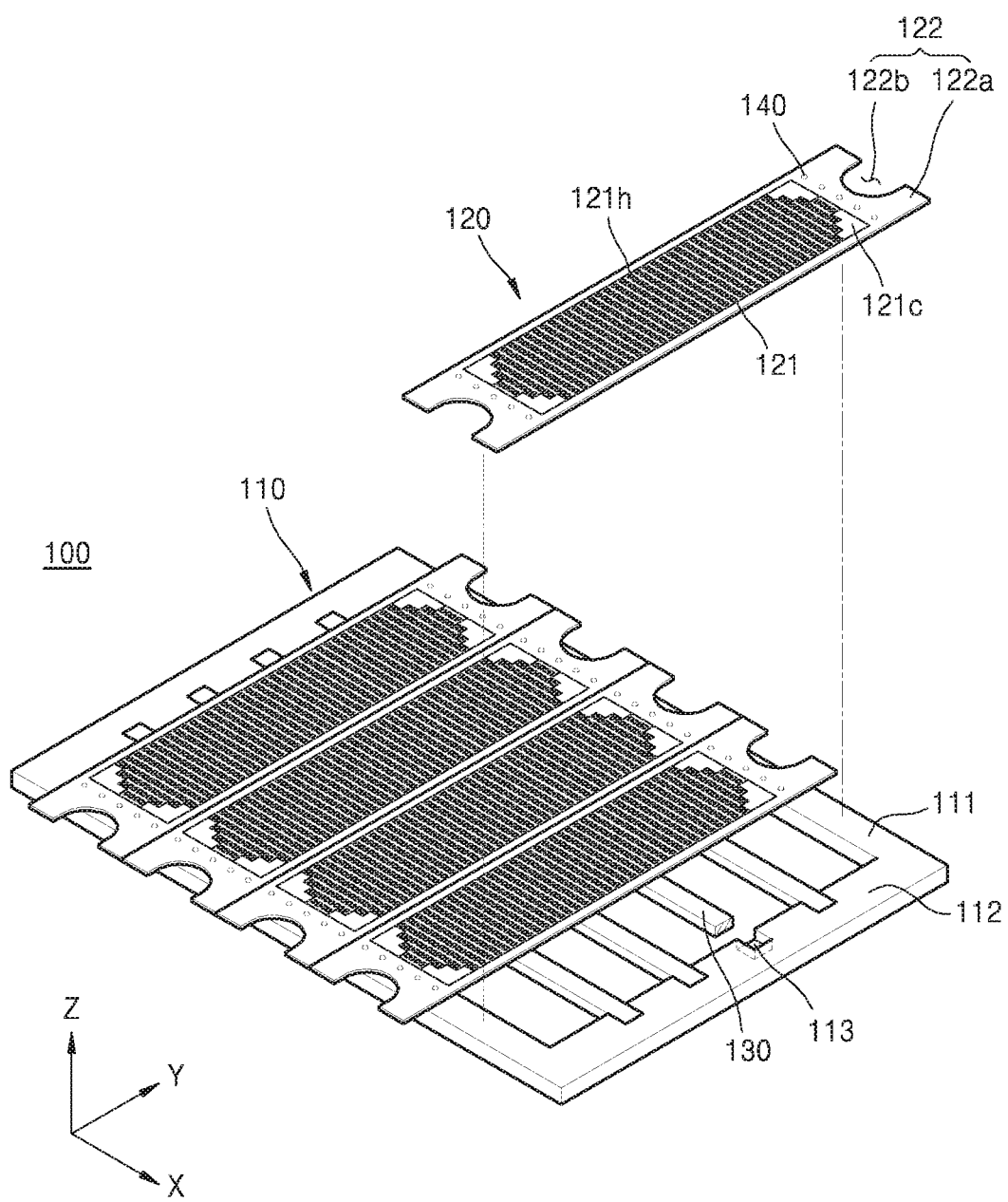
FIG. 8 is a perspective view schematically illustrating a mask frame assembly including the deposition mask of FIG. 1, according to an exemplary embodiment.

FIG. 8 is a perspective view schematically illustrating a mask frame assembly 100 including the deposition mask 120 of FIG. 1, according to the exemplary embodiment.

Referring to FIG. 8, the mask frame assembly 100 may include the frame 110, the deposition mask 120, and a support stick 130.

The frame 110 may include a metal and/or synthetic resin, and may include one or more openings having a rectangular shape. However, the exemplary embodiments are not limited thereto, and the opening may have various shapes, for example, a circular shape, a hexagonal shape, etc. For convenience of description, a case in which the opening has the rectangular shape will be described below.

The frame 110 may include a pair of first frames 111 extending in an X axis direction and a pair of second frames 112 extending in a Y axis direction and connected to the first frames 111. The first frames 111 and the second frames 112 may form the opening.

The support stick 130 may extend in the X axis direction and may be connected to the frame 110 across the opening of the frame 110. Both ends of the support stick 130 may be inserted into a groove 113 of the second frames 112 and may be fixed thereto. The support stick 130 may be fixed to the groove 113 by welding or by an adhesive attached thereto.

The deposition mask 120 may include the pattern portion 121 including the plurality of pattern holes 121h and the clamping portion 122 including the protrusion portion 122a attached to a clamp and the indentation portion 122b formed in a direction toward the pattern portion 121. A structure of the deposition mask 120 of FIG. 8 may be same as a structure of the deposition mask 120 of FIGS. 1 and 3A, and thus, the structure of the deposition mask 120 of FIG. 8 will be briefly described here.

The support stick 130 may support a plurality of the deposition masks 120. The support stick 130 may cover some of the deposition masks 120. Thus, a deposition material may pass through regions of the deposition masks 120 that are not covered by the support stick 130, whereas the deposition material may be blocked so that it is unable to pass through regions of the deposition masks 120 that are covered by the support stick 130. The support stick 130 may disperse a weight of the deposition mask 120 to prevent sagging of the deposition mask 120.

The support stick 130 may include a weakly magnetic material. For example, the support stick 130 may include stainless steel (SUS). One surface of the support stick 130 may be in contact with the deposition mask 120. If the support stick 130 includes a highly magnetic material, a strong attraction force may be generated between an electrostatic chuck (180 of FIG. 9) and the support stick 130, and thus, a gap may be generated between a substrate (11 of FIG. 9) and the deposition mask 120 or the pattern portion 121 of the deposition mask 120 may not be exactly aligned over the substrate 21. Thus, the support stick 130 including a weakly magnetic material to facilitate an exact alignment and may allow the mask frame assembly 100 and the substrate 21 to closely contact each other.

Figure 9:
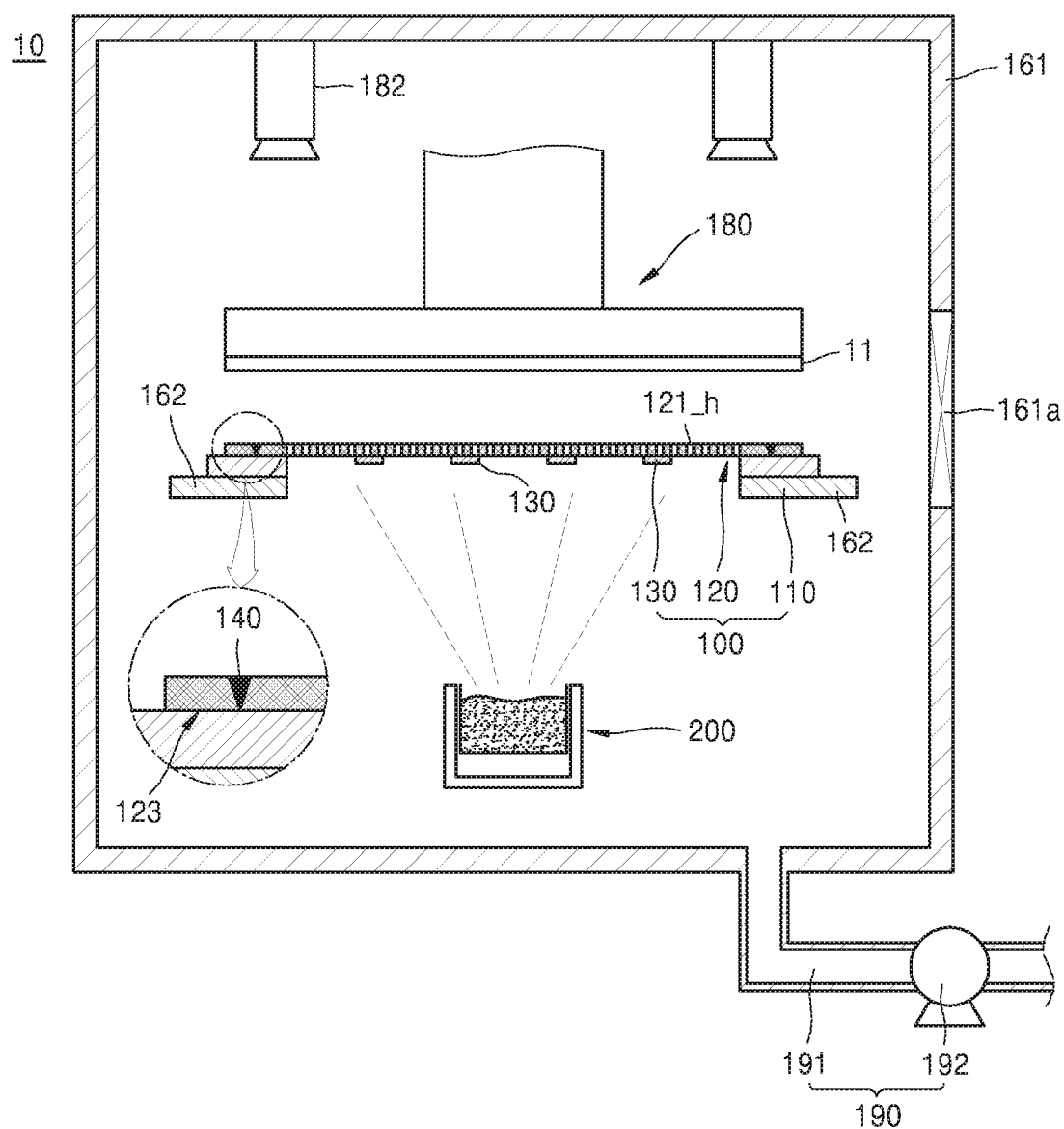
FIG. 9 is a cross-sectional view schematically illustrating an apparatus for manufacturing a display apparatus including the mask frame assembly of FIG. 8, according to an exemplary embodiment.

FIG. 9 is a cross-sectional view schematically illustrating an apparatus 10 for manufacturing a display apparatus including the mask frame assembly 100 of FIG. 8, according to the exemplary embodiment.

The apparatus 10 may include the mask frame assembly 100, a deposition source 200, a chamber 161, a supporter 162, an electromagnetic chuck 180, and a vision portion 182. In this regard, the mask frame assembly 100 of FIG. 9 is the same as the mask frame assembly of FIG. 8, and thus a description thereof will be omitted below.

The deposition source 200 may be arranged to face the mask frame assembly 100. A part of the deposition source 200 may be open toward the mask frame assembly 100. The deposition source 200 may include a heater (not illustrated) to heat a deposition material.

The deposition material may be received inside the deposition source 200. In this regard, the deposition material may include one or more of an inorganic material, a metal, and an organic material as a vaporizing or gasifying material. However, for convenience of description, a case in which the deposition material is the organic material will be described below.

An airtight space may be formed inside the chamber 161. The chamber 161 may be partially open. In this regard, a gate valve 161a for closing or opening the open part of the chamber 161 may be installed at the open part of the chamber 161.

The mask frame assembly 100 may be placed over the supporter 162. In this regard, the supporter 162 may rotate or linearly move the mask frame assembly 100.

The electromagnetic chuck 180 may align the substrate 21 over the mask frame assembly 100. The electromagnetic chuck 180 may be attached to the substrate 21 by using an electromagnetic force, and then, may align the substrate 21 over the mask frame assembly 100. In this regard, the substrate 21 may be precisely aligned over the mask frame assembly 100 by using the vision portion 182.

The apparatus 10 for manufacturing the display apparatus described above may deposit the deposition material over the substrate after supporting the substrate 21. In another exemplary embodiment, the deposition material may be deposited over the substrate 21 while the substrate 21 and the deposition source 200 move with respect to each other. However, for convenience of description, a case in which the deposition material is deposited over the substrate 21 while the substrate 21 is supported in the manufacturing apparatus 10 will be described below.

A pressure controller 190 may be installed to the chamber 161. In this regard, the pressure controller 190 may include a connection pipe 191 connected to the chamber 161 and a pump 192 installed to the connection pipe 191.

The apparatus 10 for manufacturing the display apparatus described above may be used to form an organic layer, an inorganic layer, and/or a metal layer. However, for convenience of description, a case in which the apparatus 10 for manufacturing the display apparatus forms the organic layer 11 will be described below. In particular, a case where an intermediate layer (28-2 of FIG. 11) included in the organic layer 11 will be described in detail below.

In detail, upon reviewing an operation of the apparatus 10 for manufacturing the display apparatus, the substrate 21 and the mask frame assembly 100 may be inserted into the inside of the chamber 161 and then supported by the supporter 162.

Thereafter, locations of the substrate 21 and the mask frame assembly 100 may be measured by using the vision portion 182, and then the substrate 21 and the mask frame assembly 100 may be aligned by using the electromagnetic chuck 180. In this regard, the vision portion 182 may include a camera to photograph the mask frame assembly 100 and the substrate 21.

The electromagnetic chuck 180 may be attached to the substrate 21 and the mask frame assembly 100 by using an electromagnetic force. In this regard, the electromagnetic chuck 180 may reduce a gap between the substrate 21 and the mask frame assembly 100 so that the substrate 21 and the mask frame assembly 100 are in close contact with each other.

After of the locations of the substrate 21 and the mask frame assembly 100 are aligned, the deposition material may be vaporized or gasified by operating the deposition source 200. In this regard, the deposition material may pass through the plurality of pattern holes 121_h of the plurality of deposition masks 120 and then may be deposited on the substrate 21. Thereafter, the substrate 21 on which a depositing process is completed may be taken out of the chamber 161 and then a subsequent process may be performed.

Figure 10:
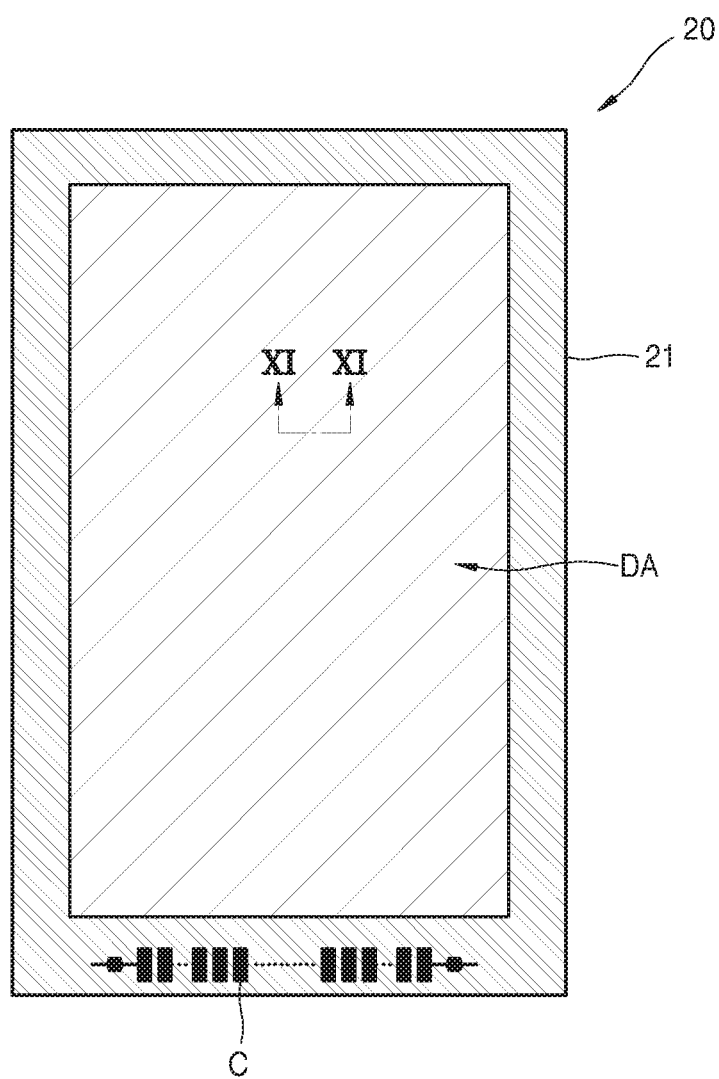
FIG. 10 is a plan view of the display apparatus manufactured using the apparatus illustrated in FIG. 9, according to an exemplary embodiment.
Figure 11:
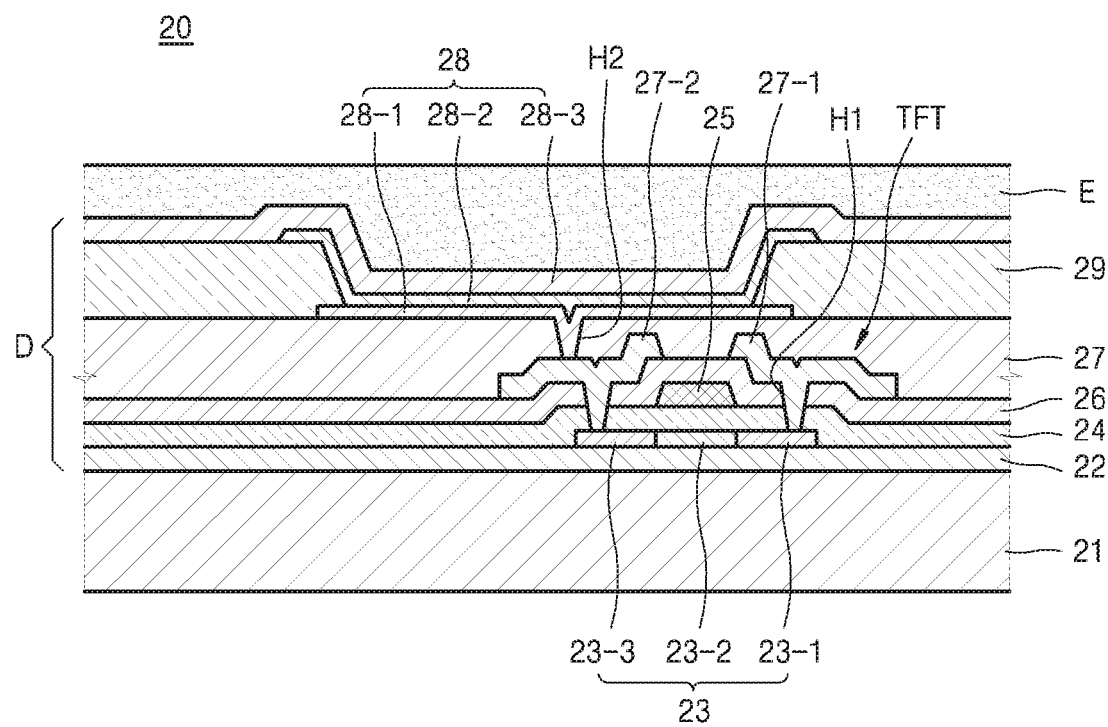
FIG. 11 is a cross-sectional view taken along a line XI-XI of FIG. 10, according to an exemplary embodiment.

FIG. 10 is a plan view of a display apparatus 20 manufactured using the apparatus 10 illustrated in FIG. 9, according to the exemplary embodiment. FIG. 11 is a cross-sectional view taken along a line XI-XI of FIG. 10, according to the exemplary embodiment.

Referring to FIGS. 10 and 11, the display apparatus 20 may include a display area DA and a non-display area outside the display area DA over a substrate 21. An emission portion D may be arranged in the display area DA. A power wiring (not illustrated) may be arranged in the non-display area. A pad portion C may also be arranged in the non-display area.

The display apparatus 20 may include the substrate 21 and the emission portion D. The display apparatus 20 may include a thin film encapsulating layer E over an upper portion of the emission portion D. In this regard, the substrate 21 may include a plastic material or a metal, such as steel use stainless (SUS), titanium (Ti), etc. The substrate 21 may include polyimide (PI). For convenience of description, a case in which the substrate 21 includes PI will be explained in detail below.

The emission portion D may be disposed over the substrate 21. In this regard, the emission portion D may include a thin film transistor TFT, a passivation layer 27 covering the thin film transistor TFT, and an organic light-emitting device (OLED) 28 over the passivation layer 27.

The substrate 21 may include a glass material. However, the exemplary embodiments are not necessarily limited thereto. The substrate 21 may include a plastic material or a metal such as SUS, Ti, etc. The substrate 21 may include PI. For convenience of description, a case in which the substrate 21 includes the glass material will be described in detail below.

A buffer layer 22 may be further disposed over the upper surface of the substrate 21 and may include an organic compound and/or an inorganic compound. The buffer layer 22 may include silicon oxide (SiOx) where x≥1 or silicon nitride (SiNx) where x≥1.

After an active layer 23 is disposed over the buffer layer 22 and arranged in a predetermined pattern, the active layer 23 may be covered by a gate insulating layer 24. The active layer 23 may include a source area 23-1, a drain area 23-3, and a channel area 23-2 disposed between the source area 23-1 and the drain area 23-3.

The active layer 23 may include various materials. For example, the active layer 23 may include an inorganic semiconductor material, such as amorphous silicon or crystal silicon. The active layer 23 may include an oxide semiconductor. The active layer 23 may also include an organic semiconductor material. However, for convenience of description, a case in which the active layer 23 includes amorphous silicon will be described in detail below.

The active layer 23 may be formed by forming an amorphous silicon layer over the buffer layer 22, crystallizing the amorphous silicon layer to form a polycrystalline silicon layer, and patterning the polycrystalline silicon layer. The active layer 23 may include the source area 23-1 and the drain area 23-3 which are doped with impurities according to a type of the thin film transistor TFT, such as a driving thin film transistor (not illustrated) and a switching thin film transistor (not illustrated).

A gate electrode 25 corresponding to the active layer 23 and an interlayer insulating layer 26 covering the gate electrode 25 may be disposed over an upper surface of the gate insulating layer 24.

A contact hole H1 may be formed in the interlayer insulating layer 26 and the gate insulating layer 24, and a source electrode 27-1 and a drain electrode 27-2 may be formed over the interlayer insulating layer 26 in contact with the source area 23-1 and the drain area 23-3, respectively, through the contact hole H1.

A passivation layer 27 may be disposed on an upper portion of the thin film transistor TFT. A pixel electrode 28-1 of the OLED 28 may be formed over an upper portion of the passivation layer 27. The pixel electrode 28-1 may contact the drain electrode 27-2 of the thin film transistor TFT through a via hole H2 formed in the passivation layer 27. The passivation layer 27 may include an inorganic material and/or an organic material in a single layer structure or a two or more layer structure. The passivation layer 27 may be a planarization layer having a flat upper surface irrespective of a curve of a lower layer, whereas the passivation layer 27 may have a curved upper surface according to the curve of the lower layer. The passivation layer 27 may include a transparent insulating material to attain optical resonance effects.

After the pixel electrode 28-1 is formed over the passivation layer 27, a pixel defining film 29 may be disposed to cover the pixel electrode 28-1 and the passivation layer 27, and may include an organic material and/or an inorganic material. At least a part of the pixel defining film 29 may be open to expose the pixel electrode 28-1.

The intermediate layer 28-2 and an opposite electrode 28-3 may be disposed at least over the pixel electrode 28-1.

The pixel electrode 28-1 may function as an anode and the opposite electrode 28-3 may function as a cathode. Polarities of the pixel electrode 28-1 and the opposite electrode 28-3 may be switched.

The pixel electrode 28-1 and the opposite electrode 28-3 may be insulated from each other by the intermediate layer 28-2. Voltages having different polarities may be respectively applied to the intermediate layer 28-2 so that light may be emitted from an organic emission layer included in the intermediate layer 28-2.

The intermediate layer 28-2 may include the organic emission layer. The intermediate layer 28-2 may further include at least one of a hole injection layer (HIL), a hole transport layer (HTL), an electron transport layer (ETL), and an electron injection layer (EIL). However, the exemplary embodiment is not limited thereto, and the intermediate layer 28-2 may include the organic emission layer and further include various functional layers.

The intermediate layer 28-2 may be formed by using the deposition mask 120 and the apparatus 10 for manufacturing a display apparatus including the deposition mask 120, as described above.

A unit pixel may include a plurality of sub-pixels that may emit various colors of light. For example, each of the plurality of sub-pixels may respectively emit a red color light, a green color light, and a blue color light. Each of the plurality of sub-pixels may also respectively emit the red color light, the green color light, the blue color light, and a white color light.

The thin film encapsulating layer E may include a plurality of inorganic layers or may include an inorganic layer and an organic layer.

The organic layer of the thin film encapsulating layer E may include a polymer. The organic layer of the thin film encapsulating layer E may include a single layer or a stack layer including at least one of polyethylene terephthalate, polyimide, polycarbonate, epoxy, polyethylene, and polyacrylate. The organic layer of the thin film encapsulating layer E may include polyacrylate. The organic layer of the thin film encapsulating layer E may include a diacrylate-based monomer or a polymerized monomer compound including the diacrylate-based monomer. A monoacrylate-based monomer may be added to the monomer compound. A photoinitiator, such as TPO, may be added to the monomer compound. However, the exemplary embodiments are not limited thereto.

The inorganic layer of the thin film encapsulating layer E may include a single layer or a stack layer that includes a metal oxide or a metal nitride. The inorganic layer of the thin film encapsulating layer E may include one of silicon nitride (SiNx), aluminum oxide (Al2O3), silicon oxide (SiO2), and titanium oxide (TiO2).

An uppermost layer of the thin film encapsulating layer E may include an inorganic layer to prevent or reduce penetration of moisture into the OLED 28.

The thin film encapsulating layer E may include at least one sandwich structure in which at least one organic layer is inserted in between at least two inorganic layers. The thin film encapsulating layer E may include at least one sandwich structure in which at least one inorganic layer is inserted in between at least two organic layers. The thin film encapsulating layer E may also include a sandwich structure in which at least one organic layer is interposed between at least two inorganic layers and a sandwich structure in which at least one inorganic layer is interposed between at least two organic layers.

The thin film encapsulating layer E may include a first inorganic layer, a first organic layer, and a second inorganic layer sequentially from an upper portion of the OLED 28.

The thin film encapsulating layer E may include a first inorganic layer, a first organic layer, a second inorganic layer, a second organic layer, and a third inorganic layer sequentially from the upper portion of the OLED 28.

The thin film encapsulating layer E may also include a first inorganic layer, a first organic layer, a second inorganic layer, a second organic layer, a third inorganic layer, a third organic layer, and a fourth inorganic layer sequentially from the upper portion of the OLED 28.

A halogenated metal layer including lithium fluoride (LiF) may be added between the OLED 28 and the first inorganic layer. The halogenated metal layer may prevent or reduce damage to the OLED 28 when the first inorganic layer is disposed by using a sputtering method.

An area of the first organic layer may be smaller than an area of the second inorganic layer. An area of the second organic layer may be smaller than an area of the third inorganic layer.

Accordingly, the display apparatus 20 may include the intermediate layer 28-2 may have an improved precision in the pattern and the location to where the intermediate layer 28-2 is deposited and formed. Accordingly, the precision of the image may be improved. The display apparatus 20 may also maintain a uniform quality by improving the precision of forming the intermediate layer 28-2 by improving the precision of repeatedly depositing multiple layers of the intermediate layer 28-2 having same pattern.

As described above, according to the exemplary embodiments, a gap between a substrate and a deposition mask may be minimized by reducing wrinkles formed in the deposition mask, and thus a shadow effect may be prevented or reduced, and the deposition mask may manufacture a high resolution display apparatus, an apparatus for manufacturing a display apparatus, and a method of manufacturing the display apparatus.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A method of manufacturing a display apparatus, the method comprising:
  inserting a substrate and a mask frame assembly into an inside of a chamber;
  aligning the substrate and the mask frame assembly; and
  depositing, on the substrate, a depositing material ejected from a deposition source and passed through the mask frame assembly,
  wherein the mask frame assembly comprises:

a frame comprising an opening at a center portion thereof;

a deposition mask disposed on the frame facing the substrate, the deposition mask being installed on the frame while being extended in a first direction by a clamp attached to both ends of the deposition mask; and a support stick extending in a second direction crossing the first direction, covering a part of the deposition mask, and supporting the deposition mask, wherein the deposition mask comprises:

a pattern portion comprising a plurality of pattern holes; and a clamping portion comprising a protrusion portion to be attached to the clamp and an indentation portion formed in a direction toward the pattern portion, wherein the pattern portion comprises a blocking portion that at least partially overlaps the protrusion portion in the first direction and has an area gradually decreasing in a second direction from the protrusion portion towards the indentation portion, the second direction crossing the first direction.

2. The method of claim 1, wherein the plurality of pattern holes are disposed corresponding to target deposition areas.

3. The method of claim 1, wherein a number of the plurality of pattern holes that overlap the protrusion portion in the first direction is less than a number of the plurality of pattern holes that overlap the indentation portion in the first direction.

4. The method of claim 1, wherein a number of the plurality of pattern holes arranged in the first direction is gradually reduced in a direction from the indentation portion toward the protrusion portion in the second direction.

5. The method of claim 1, wherein the blocking portion has an area gradually decreasing in a direction from the clamping portion toward the pattern portion in the first direction.

6. The method of claim 1, wherein the blocking portion has a multistep shape in the first direction and the second direction.

* * * * *